(12) United States Patent
Kurara et al.

(10) Patent No.: US 7,115,838 B2
(45) Date of Patent: Oct. 3, 2006

(54) UNIT FOR VARYING A TEMPERATURE OF A TEST PIECE AND TESTING INSTRUMENT INCORPORATING SAME

(75) Inventors: Hironobu Kurara, Kobe (JP); Muneaki Sonobe, Kobe (JP); Shinichi Enomoto, Sanda (JP)

(73) Assignee: Espec Corp., Osaka (JP)

( * ) Notice: Subject to any disclaimer, the term of this patent is extended or adjusted under 35 U.S.C. 154(b) by 0 days.

(21) Appl. No.: 10/885,837

(22) Filed: Jul. 7, 2004

(65) Prior Publication Data

US 2005/0040155 A1    Feb. 24, 2005

(30) Foreign Application Priority Data

Jul. 23, 2003    (JP) .............................. 2003-277978

(51) Int. Cl.
*H05B 3/68* (2006.01)
*A21B 2/00* (2006.01)

(52) U.S. Cl. ............................... 219/444.1; 219/443.1; 219/448.11; 219/445.1; 219/448.12; 392/416; 392/418; 118/724; 118/725; 118/50.1

(58) Field of Classification Search ............. 219/444.1, 219/443.1, 448.11, 445.1, 446.1, 447.1, 448.12, 219/449.1, 454.11, 390, 405, 411; 392/416, 392/418; 118/724, 725, 50.1
See application file for complete search history.

(56) References Cited

U.S. PATENT DOCUMENTS 6,392,205 B1 *    5/2002    Minonishi ................ 219/443.1

* cited by examiner

*Primary Examiner*—Shawntina Fuqua
(74) *Attorney, Agent, or Firm*—Wood, Phillips, Katz, Clark & Mortimer (57) ABSTRACT

A disc-type unit 10 adjusts temperature of a control face 14 by means of a heater 12 and coolant, with a hollow plate 11 to which the heater 12 is secured, a cavity 13 formed in the hollow plate 11 and a piping 20 for supplying the coolant to the cavity 13, the piping 20 opening in the cavity 13, and the coolant being jetted to a portion to which the heater 12 is secured or a portion in proximity thereto and which shows high temperature rise when energizing the heater 12.

22 Claims, 9 Drawing Sheets

UNIT FOR VARYING A TEMPERATURE OF A TEST PIECE AND TESTING INSTRUMENT INCORPORATING SAME

BACKGROUND OF THE INVENTION

1. Field of the Invention

The present invention relates to a unit for varying a temperature of a test piece by controlling a temperature of a control face. The present invention further relates to testing instruments incorporating the unit for environmental tests such as temperature and humidity chambers and for temperature tests of semiconductor wafers, electronic components and the like.

2. Description of Related Art

Temperature tests for electronic components such as integrated circuits are conventionally performed as burn-in tests. The burn-in tests of integrated circuits are done by separating several integrated circuits formed on a semiconductor wafer into individual bare dies and exposing each of the integrated circuits, which are packaged with sealing each separated bare die, in high temperature while turning electricity through the circuit. By means of the burn-in tests, it is enabled to reveal potential drawbacks in the integrated circuits within a short period of time and remove defects effectively by initial malfunction and aged deterioration.

Such burn-in tests, though, take a lot of time since they require individual packaged integrated circuits to be mounted at testing instruments. Further, the individual packaged integrated circuits have to be heated, resulting in troubles such as enlargement of testing instruments and increase of heat. Still further, the integrated circuit which is discriminated as a defect by the burn-in tests has to be disposed of, resulting in a factor to cause useless process of package.

Recently, the demand of a bare chip mounting is increased. The bare chip mounting is the method to separate a plurality of integrated circuits formed on a semiconductor wafer into individual bare dies and mount the separated bare dies directly at a board. In order to achieve such a bare chip mounting and excluding useless packaging, testing instruments of a burn-in test during a state of the semiconductor wafer is now being developed.

Figure 8A:
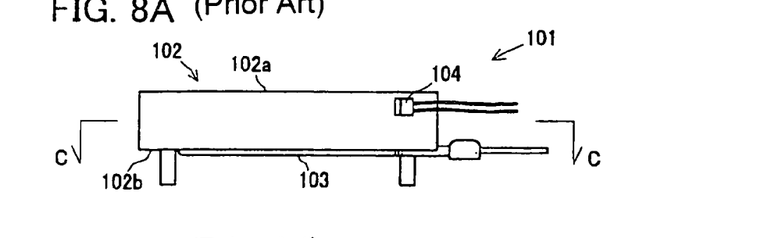
FIG. 8A is a front view of a unit for varying a temperature of a test piece in the related art.
Figure 8B:
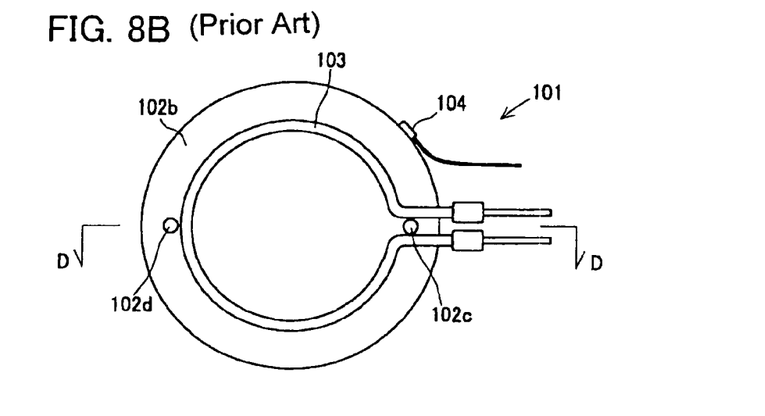
FIG. 8B is a bottom view of the unit shown in FIG. 8A.
Figure 8C:
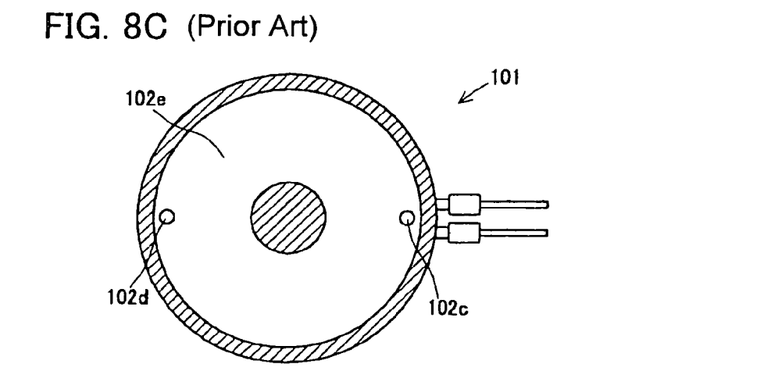
FIG. 8C is a cross-sectional view taken along line C—C of FIG. 8A.
Figure 8D:
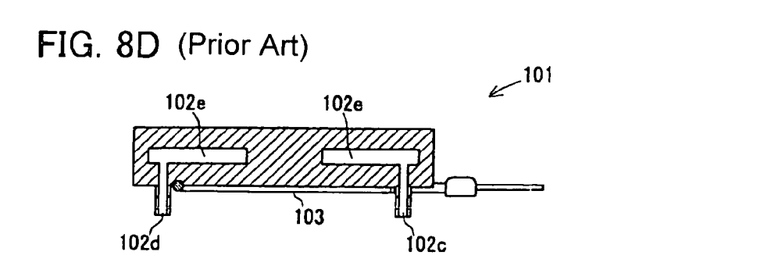
FIG. 8D is a cross-sectional view taken along line D—D of FIG. 8B.

FIGS. 8A–8D show an example of a unit 101, for varying a temperature of a test piece, to be incorporated in a testing instrument in the related art. FIG. 8A is a front view of the unit 101, FIG. 8B is a bottom view thereof, FIG. 8C is a cross-sectional view taken along line C—C of FIG. 8A, and FIG. 8D is a cross-sectional view taken along line D—D of FIG. 8B.

The unit 101 comprises a disc-shaped hollow plate 102 provided with a heater 103 and a piping 102e. The heater 103 is a sheathed heater of an annular shape secured to a bottom face 102b of the plate 102. The plate 102 has a ring-shaped cavity 102e therein, which functions as a piping 102e. The piping 102e has one end being an opening 102c for supplying coolant and the other end being an opening 102d for recover the coolant. A temperature sensor 104 is attached on an outer peripheral wall of the plate 102.

Figure 9:
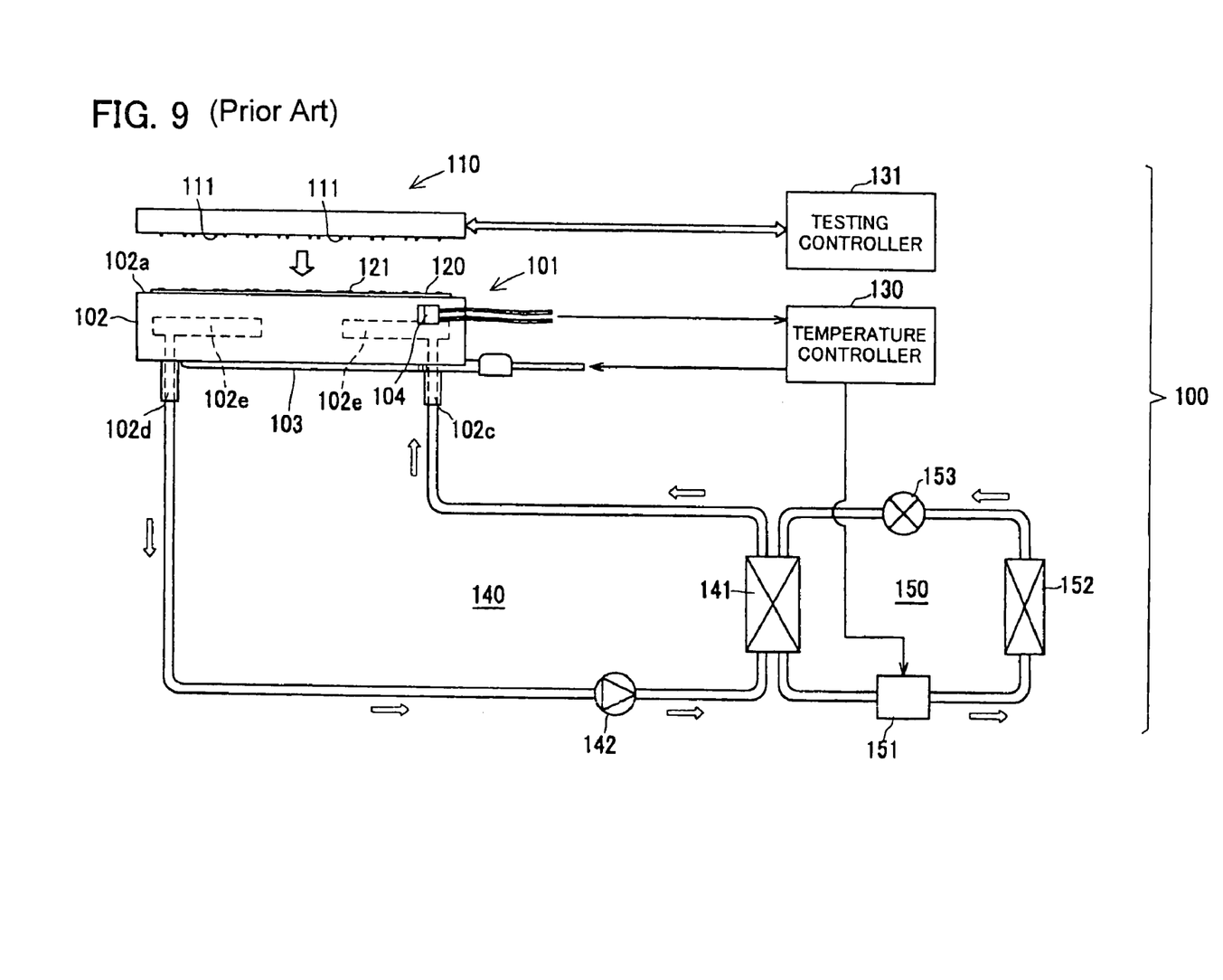
FIG. 9 is a schematic illustration of an example of a testing instrument in the related art using the unit shown in FIGS. 8A–8D.

FIG. 9 is an example of a schematic illustration of a testing instrument 100 using such a unit 101 in the related art. A temperature controller 130 controls to energize the heater 103 and also controls a cooling circuit 150 so that the unit 101 can be heated and cooled.

The cooling circuit 150, which is formed by connecting in series a compressor 151, a condenser 152, an expansion valve 153 and a primary side of a heat exchanger 141, is a cooling circuit for circulating the coolant consisting of refrigerant such as a hydrofluorocarbon or a hydrochlorofluorocarbon therein. A secondary coolant circuit (viz. a brine circuit) 140, which is formed by connecting in series the unit 101, a circulating pump 142 and a secondary side of the heat exchanger 141, is a circuit for circulating a brine (viz. salt water) by the pump 142.

In the cooling circuit 150, the refrigerant compressed at the compressor 151 is liquefied by cooling at the condenser 152, and the liquefied refrigerant flows into the heat exchanger 141 in liquid phase or in gas-liquid mixture phase while being decompressed with the expansion valve 153. Then latent heat of vaporization of the refrigerant absorbs heat from the brine which flows in the secondary side of the heat exchanger 141. On the other hand, in the secondary coolant circuit 140, the brine cooled by the heat exchanger 141 flows into the unit 101, flowing in the piping 102e so as to cool the hollow plate 102. Then the brine with increased temperature flows out of the plate 102, returns through the circulating pump 142 to the heat exchanger 141 and circulates with being cooled again.

In other words, the temperature controller 130 controls the compressor 151 for adjusting the temperature of the brine to be cooled, so as to cool the unit 101 while adjusting the temperature of the brine which circulates in the unit 101.

The testing instrument 100 in the related art shown in FIG. 9 performs a semiconductor wafer burn-in test according to the following procedure. The heater 103 and the compressor 151 are controlled so that the temperature detected by the temperature sensor 104 corresponds to predetermined temperature at the temperature controller 130. On the other hand, a semiconductor wafer 120 (a test piece) to be brought to the burn-in test is put on a top face 102a (a control face) of the unit 101 and then a prober 110 is put on the semiconductor wafer 120 so as to cover the top face thereof. Thereby a number of probes 111 on the prober 110 come in contact with bumps 121 on the semiconductor wafer 120 so as to turn electricity through each integrated circuit of the semiconductor wafer 120 from a testing controller 131 via the prober 110.

In such arrangement, the semiconductor wafer 120 is driven in the energized condition determined at the testing controller 131, while the burn-in test is performed under temperature determined at the unit 101, so that an abnormal chip is detected at the testing controller 131 for being distinguished from a normal chip.

However, the testing instrument 100 in the related art shown in FIG. 9 employs a structure to flow the coolant toward one direction in the piping 102e for cooling the unit 101. In this case, it is required that the coolant should not cause a change of phase while flowing in the piping 102e. That is because the temperature of the top face 102a of the hollow plate 102 is not maintained uniformly and a cooling efficiency of the coolant decreases, both resulting from a remarkable change of a heat transfer rate, when the coolant causes a change of phase while flowing in the piping 102e.

Consequently, the testing instrument 100 in the related art shown in FIG. 9 had to employ a structure to circulate the brine, which causes no change of phase regardless of fluctuation of an amount of heat, in the secondary coolant circuit 140 for cooling the unit 101, and to cool the brine circulating in the secondary coolant circuit 140 by use of another cooling circuit 150. In such a structure, a system for cooling the unit 101 is extremely complicated, resulting in preventing stability and response of temperature control and/or reduction of volume and cost of apparatus.

It is therefore an object of the present invention made in view of the problems and drawbacks described above to provide an advanced unit for varying a temperature of a test piece with a simple structure which has improved stability and response of temperature control. It is a further object of the present invention proposed simultaneously is to provide an advanced testing instrument employing the unit described above for achieving reduction of volume and cost thereof.

SUMMARY OF THE INVENTION

One of aspects of the present invention to solve the problem described above is to provide a unit for varying a temperature of a test piece by controlling a temperature of a control face comprising a hollow plate having a cavity formed therein, an inner surface defining the cavity, and an outer surface, a piping for supplying a coolant therethrough, and a heater thermally in contact with the plate, wherein the outer surface has a portion acting as the control face, and wherein the piping is combined with the plate so as to have at least one outlet in the cavity, so that the coolant is jetted toward a target area within the cavity so as to control temperature of the control face by means of the heater and the coolant.

In this present invention, the coolant supplied through the piping is jetted not in disorder but toward the target area within the cavity concentratively. The target area where the coolant is jetted is cooled much more than the other area where the coolant is not jetted. Proper selection of the target area enables to stabilize a temperature distribution of the control face and to readily control temperature as compared with some unit in the related art which supply the coolant in disorder within the cavity.

It is preferable that the test piece is disposed in touch with the control face. More preferably, the test piece is mounted on the control face.

It is preferable that the coolant is a refrigerant that is in gas phase at normal temperature and in liquid phase or in gas-liquid mixture phase when it is supplied toward the target area.

When evaporating, the refrigerant in liquid phase or in gas-liquid mixture phase changes to that in gas phase and absorbs latent heat from the surroundings. Thus, when the refrigerant finishes to absorb the latent heat and gasifies, its cooling capacity may be remarkably decreased. Therefore, supplying the liquefied refrigerant to the cavity in disorder might cause decreasing of the cooling capacity as the refrigerant gasifies with uneven temperature of the control face.

As the method for cooling the control face uniformly by use of the liquefied refrigerant, it is nominated to cool the control face as maintaining the refrigerant in liquid phase or a gas-liquid mixture phase at least within the cavity. However, it causes a problem that the refrigerant is recovered in liquid phase or in gas-liquid mixture phase, that is, a problem of liquid compression.

However, in the unit in this aspect, the liquefied refrigerant is jetted into the cavity not in disorder but toward the target area within the cavity.

Especially, in this preferred aspect, using the refrigerant in liquid phase or in gas-liquid mixture phase, even if the hollow plate is under low temperature, can cool rapidly the area where the refrigerant is jetted and let the refrigerant lose the cooling capacity after quick gasification thereof. Consequently, as compared with the case to cool by jetting the brine or the like, the area where the refrigerant is jetted is cooled directly and in pinpoint accuracy, so that the rest of the area where the refrigerant is not jetted is hardly directly cooled. Further, in this preferred aspect, the refrigerant gasifies as soon as cooling the area where the refrigerant is jetted, so that there is no problem at all about the liquid compression of the recovered refrigerant described above.

In this preferred aspect, it employs a structure to cool the unit not using a secondary coolant (viz. brine) in the related art but using the liquefied refrigerant to be directly supplied to the unit. In such a structure, it does not require another conventional cooling device for cooling the secondary coolant, so that it makes possible to extremely simplify the cooling system for supplying the coolant to the unit.

It is preferable that the heater is secured to at least one of the faces making up the outer surface of the plate except the control face.

In such a unit for varying a temperature of a test piece, the heater secured to only one face of the outer surface of the hollow plate can bring about the predetermined temperature distribution of the control face. In such a structure, the number of necessary parts can be reduced and accordingly the structure can be simplified. If the heater secured to only one face of the plate might not bring about the predetermined temperature distribution, heaters may be secured separately to at least two faces thereof. Such a structure enables to readily adjust the predetermined temperature distribution of the control face and accordingly to design readily.

Preferably the hollow plate is of a substantially cylindrical shape with its top face acting as the control face, wherein the heater is of an annular shape and secured to a portion of the bottom face of the plate, and wherein the target area is the inner surface area of the portion to which the heater is secured.

In such a unit, when the heater is energized, a part of generated heat is transferred from the face to which the heater is secured to the control face via a peripheral wall part. Further, the rest of the heat is transferred by diffusing over the whole face to which the heater is secured. Thus, when heating the face to which the heater is secured, the heat is transferred to the control face therefrom by heat radiation via the cavity and/or convection of gas filled in the cavity.

Consequently, proper positioning of the portion (annular portion) to which the annular heater is secured can make the temperature distribution of the control face by heating by the heater uniformly and further in a predetermined pattern.

Further, in such a unit, the coolant is jetted toward the annular portion of the hollow plate, to which the heater is secured, from inside. Consequently, the area to which the coolant is jetted is that of showing high temperature rise when the heater is energized.

Preferably the piping comprises a main pipe extending out of the plate and a plurality of branch pipes extending radially from the main pipe in the cavity, the main pipe being positioned substantially along the central axis of the heater, and each of the branch pipes having one end in fluid communication with the main pipe and the other end directed to the target area.

In such a unit, the main pipe extending out of the plate is positioned substantially along the central axis of the heater. Further the branch pipes extending radially from the main pipe in the cavity have one end in fluid communication with the main pipe and the other end directed to the target area.

Consequently, all the branch pipes extending from the main pipe have the same length, so that the coolant is distributed uniformly thereto so as to be jetted from the ends thereof. In this arrangement, the coolant jetted from each branch pipe enables to cool substantially uniformly the annular portion, to which the heater is secured, from inside.

In such a unit, it is possible to position properly the portion to branch into the branch pipes from the main pipe. For example, it is possible to employ a structure to branch into the branch pipes from the main pipe within the cavity. Further, it is also possible to employ a structure to branch into the branch pipes from the main pipe outside of the cavity, that is, outside of the plate.

Further, in such a unit, it is preferable that each branch pipes extending in the cavity is not in contact with the inner surface of the cavity. That is because heat exchange between the coolant flowing in the branch pipes and the hollow plate might cause an uneven temperature distribution of the control face, if any branch pipe is in contact with the inner surface of the cavity. Consequently, it is preferable that the branch pipes are supported in cantilevered fashion within the cavity only by the main pipe.

The piping may comprise a main pipe and a disc-shaped coolant distributor, the main pipe being positioned substantially along the central axis of the annular heater, wherein the distributor has a cavity therein in communication with the main pipe and further has a plurality of openings so as to make the cavity in the distributor to communicate with the cavity in the plate, the openings facing to the target area.

In such a unit, the piping extending out of the plate is positioned substantially along the central axis of the annular heater. Further, the disc-shaped coolant distributor has the cavity therein in communication with the main pipe and further has a plurality of openings so as to make the cavity in the distributor to communicate with the cavity in the hollow plate, the openings facing to the target area. In this arrangement, the coolant jetted from each opening enables to cool substantially uniformly the annular portion to which the heater is secured from inside of the cavity in the plate.

In such a unit, it is also preferable that the coolant distributor is not in contact with the inner surface of the cavity in the plate so as not to cause uneven temperature distribution of the control face, and accordingly, it is preferable to support the coolant distributor in cantilever fashion within the cavity in the plate only by the main pipe.

A coolant recovery portion is preferably formed adjacent to the main pipe so as to recover coolant jetted into the cavity in the plate.

In such an unit, if the coolant recovery portion is misarranged relative to each branch pipe extending radially in the cavity, it would cause bias of the pressure in the coolant gas filled in the cavity. As a result, it is liable to cause uneven pressure on each branch pipe and accordingly a difference of the amount of the coolant to be jetted.

In such a unit, the coolant recovery portion is formed adjacent to the main pipe, so as to achieve the substantially uniform pressure on each branch pipe. Therefore, the amount of coolant being distributed to each branch pipe is able to be uniformed, whereby it enables to cool substantially uniformly the portion to which the heater is secured.

Another aspect of the present invention is to provide a unit for varying a temperature of a test piece by controlling a temperature of a control face comprising a hollow plate having a cavity formed therein, an inner surface defining the cavity, and an outer surface, a piping for supplying a coolant therethrough, and a heater thermally in contact with the plate, wherein the outer surface has a portion acting as the control face, and wherein the piping is combined with the plate so as to have at least one outlet in the cavity, so that the coolant is jetted toward a target area within the cavity so as to control temperature of the control face by means of the heater and the coolant, wherein the target area is determined so that a temperature change in the target area produces a temperature change of the control face with a substantially uniform temperature distribution over the whole control face.

In this aspect, the coolant supplied through the piping is jetted not in disorder but toward the target area within the cavity concentratively, where the control face is cooled with a substantially uniform temperature distribution thereof.

That is, the target area where the coolant is jetted is cooled much more than the other area where the coolant is not jetted, when jetting the coolant thereto, regardless of energizing the heater.

Consequently, in this aspect, supplying the coolant while the heater is not energized enables to cool the control face with the substantially uniform temperature distribution.

Further, supplying the coolant during heating by the heater enables to cool or heat the control face roughly with the predetermined pattern of the temperature distribution thereof by heating by the heater.

In this arrangement, as compared with a structure to supply the coolant in the cavity in disorder, it is able to stabilize the temperature distribution and accordingly to readily control temperature.

The heater is preferably secured to a portion, being a part of the plate, so that a temperature change in the portion produces a temperature change of the control face with a substantially uniform temperature distribution over the whole control face.

A part of the heat generated at the heater is directly transferred to the control face by conduction via the hollow plate, whereas the rest of the heat is transferred to the control face by radiation through the cavity and/or convection of gas filled in the cavity. Such heat transfers described above produce the temperature rise of the control face. Consequently, proper setting of the shape and/or the portion to which the heater is secured in response to the shape and/or materials of the plate, at the same time as the proper setting of shape and/or materials (viz. heat conductive efficiency) enables to achieve the substantially uniform temperature distribution over the whole face of the control face by heating by the heater.

For this reason described above, it is able to heat and cool the hollow plate when heating by the heater with the predetermined pattern of the temperature distribution of the control face, that is, with the substantially uniform temperature distribution thereof.

Further, it is possible to let the portion to which the heater is secured in the cavity to correspond to or coincide with the portion to which the coolant is jetted by the piping. Such a structure also enables to heat and cool the control face with the substantially uniform temperature distribution thereof.

Still another aspect of the present invention is to provide a unit for varying a temperature of a test piece by controlling a temperature of a control face comprising a hollow plate having a cavity formed therein, an inner surface defining the cavity, and an outer surface, a piping for supplying a coolant therethrough and a heater thermally in contact with the plate, wherein the outer surface has a portion acting as the control face, and wherein the piping is combined with the plate so as to have at least one outlet in the cavity, so that the coolant is jetted toward a target area within the cavity so as to control temperature of the control face by means of a heater and coolant, wherein the target area is the inner surface area of the portion to which the heater is secured or the proximity of the inner surface area, the target area being determined so that it shows especially high temperature rise when the heater is energized.

In this aspect, the coolant supplied through the piping is jetted not in disorder but toward the target area within the cavity being determined so that it shows especially high temperature rise when the heater is energized.

In this aspect, when the coolant is supplied during heating by the heater, the coolant jetted within the cavity cools concentratively the target area, with the result that heat exchange of the coolant decreases rapidly the cooling capacity thereof. That is, when supplying the coolant during heating by the heater, the target area is directly cooled by jetting of the coolant, and the other area where the coolant is not jetted is hardly directly cooled by jetting of the coolant.

Further, in this aspect, when the heater is not energized, jetting the coolant toward the target area makes the target area be more cooled than the other area where the coolant is not jetted.

That is, regardless of energizing of the heater, jetting the coolant to the target area being determined so that it shows especially high temperature rise when the heater is energized makes it possible to cool the control face with a substantially same pattern of the temperature distribution thereof as the case to be heated by the heater.

Thus, in this aspect, controlling the heater and the amount of coolant enables to heat or cool the control face with the pattern of the temperature distribution thereof when the heater is energized.

In this way, as compared with the case to cool by supplying the coolant in the cavity in disorder, it is able to stabilize the temperature distribution of the control face and accordingly to readily control temperature.

Yet another aspect of this present invention is to provide a testing instrument comprising a unit for varying a temperature of a test piece by controlling a temperature of a control face and a cooling device for liquefying gasified refrigerant, the unit comprising a hollow plate having a cavity formed therein, an inner surface defining the cavity, and an outer surface, a portion of the outer surface acting as a control face, a piping for supplying a refrigerant therethrough, and a heater thermally in contact with the plate, wherein the piping is combined with the plate so as to have at least one outlet in the cavity, wherein the outer surface has a portion acting as the control face, and wherein the cooling device is connected to the piping and the cavity so as to form a cooling circuit to circulate the refrigerant therein, so that the refrigerant is jetted toward a target area within the cavity so as to control temperature of the control surface by means of the heater and the refrigerant, the plate being cooled by means of the latent heat of vaporization of the refrigerant.

In this aspect, to flow the liquefied refrigerant directly in the unit cools the hollow plate with the help of latent heat of vaporization of the refrigerant. That is, the refrigerant accompanied with a change of phase is supplied directly to the unit so as to cool it. Consequently, as compared with the cooling system for circulating such as a secondary coolant (viz. brine) to the unit, it dispensed with another cooling device for cooling the brine. As a consequence, it is able to extremely simplify the cooling system, accordingly to reduce size and cost of the testing instrument.

The testing instrument in this aspect can perform temperature tests for several kinds of apparatus or devices to be tested. A semiconductor wafer made up of a number of integrated circuits is one of the examples. Besides apparatus or devices to be tested such as electronic components and electric apparatus manufactured using electronic components or integrated circuits are able to be tested by changing the shape of the unit corresponding to the apparatus or devices to be tested.

Preferably the hollow plate has a substantially cylindrical shape with its top face acting as the control face, wherein the heater is of an annular shape and secured to the bottom face of the plate, and wherein the target area is the inner surface area of the portion to which the heater is secured.

In such a testing instrument, proper positioning of the portion to which the annular heater is secured can make the temperature distribution of the control face of the unit by heating by the heater uniformly and further in a predetermined pattern. Consequently, using such a testing instrument enables to perform the test more precisely.

Preferably the piping comprises a main pipe and a plurality of branch pipes extending radially from the main pipe, the main pipe being positioned substantially along the central axis of the heater, and each of the branch pipes having one end in fluid communication with the main pipe and the other end directed to the target area.

In such a testing instrument, all the branch pipes extending from the main pipe have the same length, so that the coolant which is supplied to the piping is distributed evenly thereto so as to be jetted from the ends thereof. In this arrangement, as for the unit, the coolant jetted from each branch pipe enables to cool substantially uniformly the annular portion, to which the heater is secured, from inside of the cavity. As a result, it is possible to make the temperature distribution of the control face of the unit more evenly. As a consequence, using such a testing instrument enables to perform the test more precisely.

THE PREFERRED EMBODIMENTS

Now, a preferred embodiment of the present invention will be described below in detail, making reference to the accompanying drawings. A semiconductor wafer testing instrument and a unit for varying a temperature of a test piece incorporated in this testing instrument are illustrated in the description below.

Figure 1A:
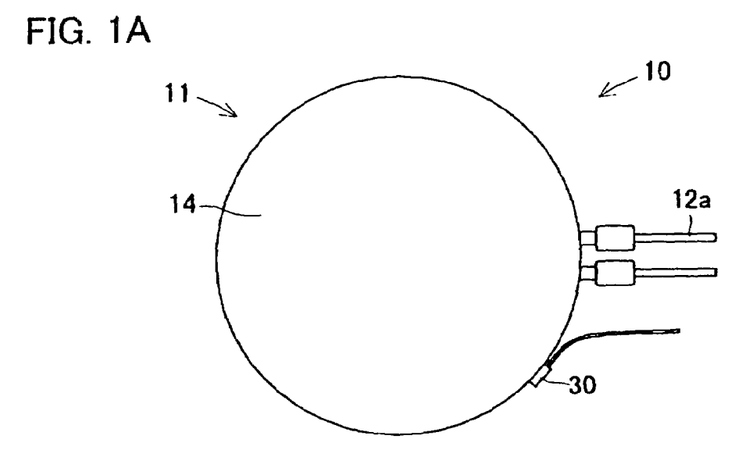
FIG. 1A is a plan view of a unit for varying a temperature of a test piece that is a preferred embodiment of this invention.
Figure 1B:
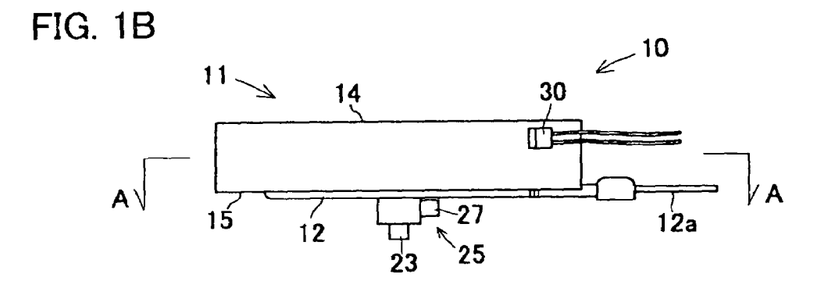
FIG. 1B is a front view of the unit shown in FIG. 1A.
Figure 1C:
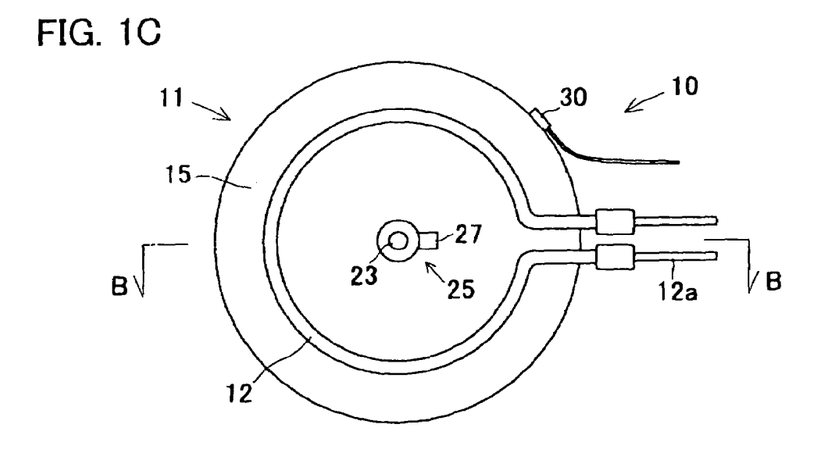
FIG. 1C is a bottom view of the unit shown in FIG. 1A.
Figure 2A:
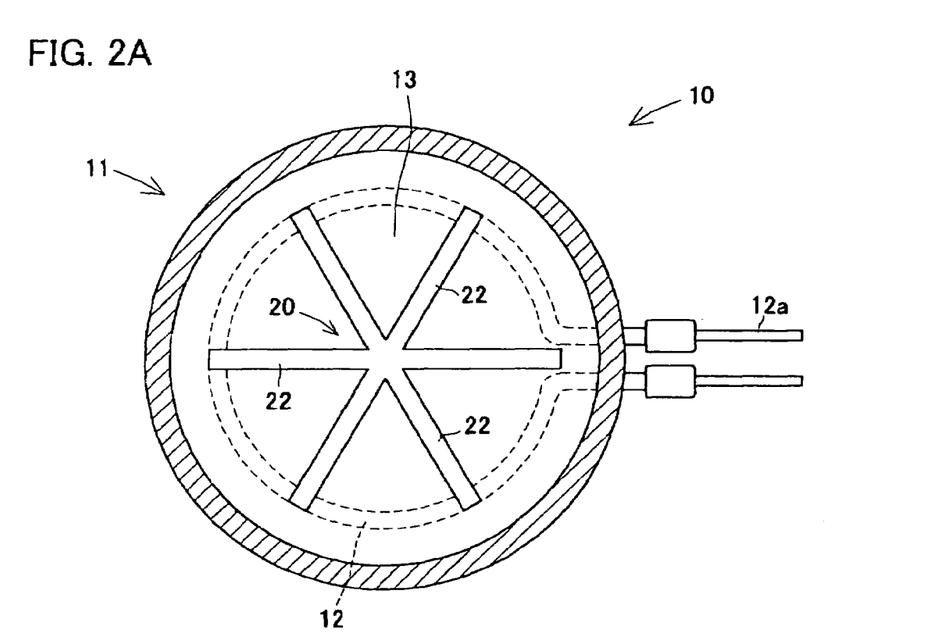
FIG. 2A is a cross-sectional view taken along line A—A of FIG. 1B.
Figure 2B:
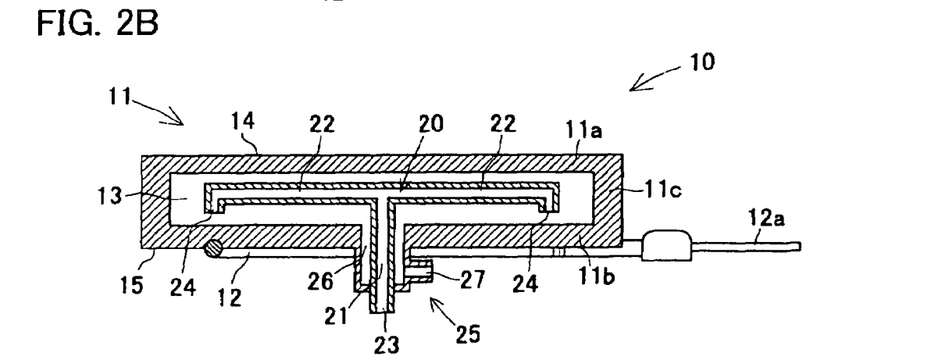
FIG. 2B is a cross-sectional view taken along line B—B of FIG. 1C.
Figure 3:
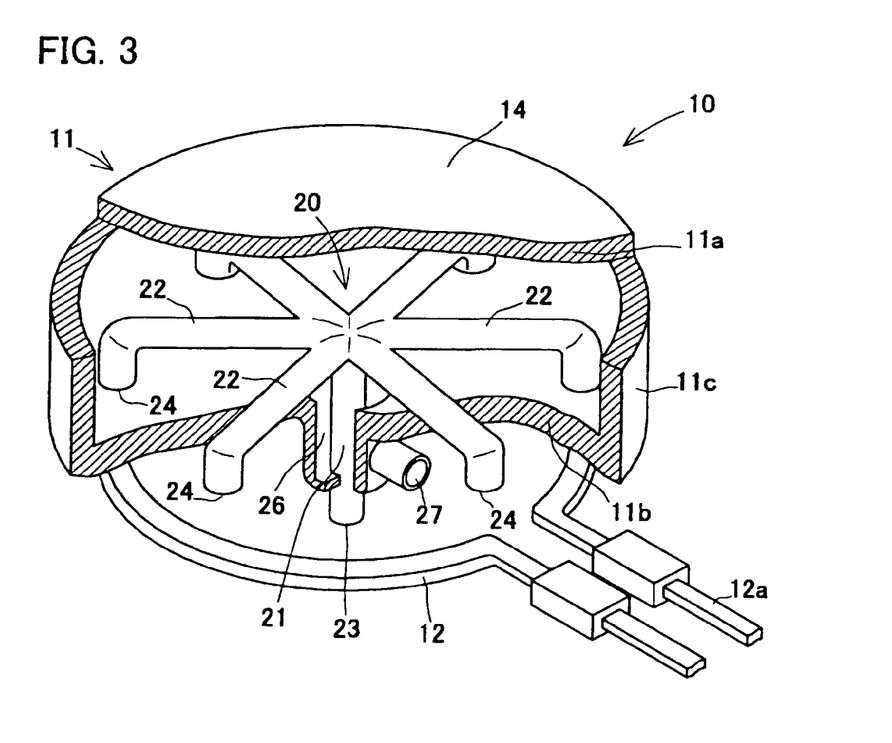
FIG. 3 is a partly broken perspective view of the unit shown in FIGS. 1A–1C.

FIGS. 1A–1D show a plate-type unit 10 for varying a temperature of a test piece relating to the preferred embodiment. Describing in detail, FIG. 1A is a plan view of the plate-type unit 10, FIG. 1B is a front view thereof and FIG. 1C is a bottom view thereof. FIG. 2A is a cross-sectional view taken along line A—A of FIG. 1B, whereas FIG. 2B is a cross-sectional view taken along line B—B of FIG. 1C. FIG. 3 is a partly broken perspective view of the plate-type unit 10 shown in FIGS. 1A–1C.

The plate-type unit 10 of the preferred embodiment comprises a disc-shaped hollow plate 11 with a cavity 13 formed therein and having a heater 12. Describing sequentially, the plate 11 is made of a die-cast aluminum alloy, which has high thermal conductivity, and of a substantially cylindrical shape, the height of which is shorter than its diameter, and with the cavity 13. In other words, the plate 11 comprises a disc-shaped upper part 11a, a disc-shaped bottom part 11b and a peripheral wall 11c connecting the parts, with the cavity 13 of a substantially cylindrical shape defined therein. A top face 14 of the plate 11 is a flat circular plate as seen in FIG. 1A and functions as a control face 14 for maintaining predetermined temperature by contacting on a semiconductor wafer, which is a device to be tested.

The heater 12 has the function of heating the hollow plate 11 and, as seen in FIGS. 1C and 2B, is secured in circular to a bottom face 15 of the plate 11 which is opposite to the control face 14. In this preferred embodiment, the heater 12 is a sheathed heater, as seen in FIG. 2B, which is secured in circular to the bottom part 11b at a slightly inner portion of an outer periphery edge of the bottom face 15. Both ends of the heater 12 extend to the right direction in FIGS. 1A to 2B of the plate 11 so as to be connected with electricity-feeding wires 12a.

The cavity 13 serves to cool the hollow plate 11 by supplying the coolant or refrigerant therein. In the cavity 13, as seen in FIGS. 2A to 3, a piping 20 consisting of a main pipe 21 and branch pipes 22 is disposed and the coolant will be supplied to the cavity 13 therethrough.

Structure of the piping 20 will be described below further in detail. The main pipe 21, as seen in FIGS. 2B and 3, is a pipe passing substantially along the central axis of the bottom part 11b of the hollow plate 11 up to the cavity 13 and a bottom end thereof has the function of an opening 23 for supplying the coolant. A top end of the main pipe 21 branches into six branch pipes 22 arranged at substantially regular angular intervals and extending radially in the horizontal directions within the cavity 13. Each end (hereinafter called as a nozzle) 24 of the each branch pipe 22 extends to an upper side of the portion to which the heater 12 is secured and is bent downwards toward the heater 12. In other words, in the cavity 13, the branch pipes 22 from the main pipe 21 are arranged with the nozzles 24 faced to an annular portion of the inner surface of the bottom part 11b adjacent to the heater 12.

Further, as seen in FIGS. 2B and 3, a recovery portion 25 for recovering the coolant is formed around the main pipe 21. The recovery portion 25 is provided with a recovery piping 26 which is formed around the portion where the main pipe 21 passes through the bottom part 11b and a recovery outlet 27 that is connected with the recovery piping 26 and extends horizontally.

A coolant or refrigerant supplied to the plate-type unit 10 flows through the following route. As seen in FIG. 3, the coolant supplied from the opening 23 rises in the main pipe 21 so as to flow separately into six branch pipes 22. The coolant flowing separately is jetted from the each nozzle 24 of the each branch pipe 22 toward the bottom part 11b so as to be filled in the cavity 13. The coolant filled in the cavity 13 is discharged through the recovery piping 26 and the recovery outlet 27. Thus, flowing of the coolant through the route described above brings cooling of the hollow plate 11.

As seen in FIGS. 2B and 3, this embodiment employs structure without any support portion for supporting the branch pipes 22 between the branch pipes 22 that extends radially and the upper and bottom parts 11a and 11b of the hollow plate 11. In other words, within the cavity 13, each branch pipe 22 is supported in cantilevered fashion only by the main pipe 21, which stands upright at the center of the branch pipes. In such a structure, it is possible to avoid a heat absorption from the upper and bottom parts 11a and 11b of the plate 11 and also a consequent generation of uneven temperature distribution on the control face 14, when the coolant flows in the branch pipes 22.

This embodiment employs a structure with 6 branch pipes 22, though it may also possible to simplify the structure with 5 or less of the branch pipes 22. Further it may be possible to be constructed with 7 or more of the branch pipes 22, and in this case, it makes possible to jet the coolant more uniformly along the portion to which the heater 12 is secured. Still further it may be possible to be constructed in such a manner as branching into more in the branch pipes 22.

Figure 4A:
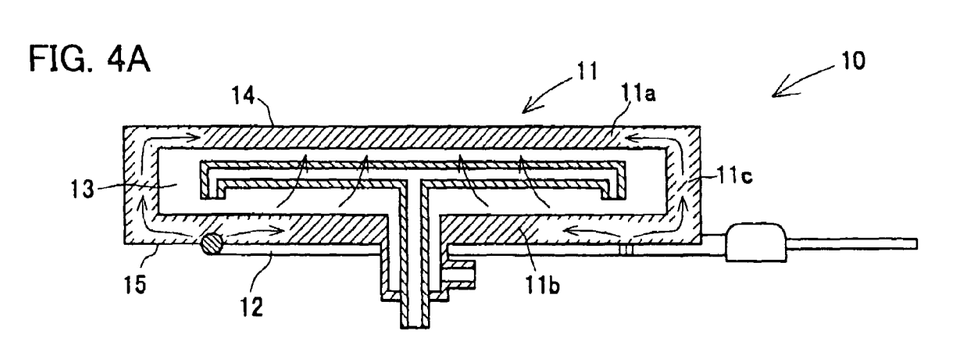
FIG. 4A is a schematic illustration showing heat transfer during heating of the unit shown in FIGS. 1A–1C.
Figure 4B:
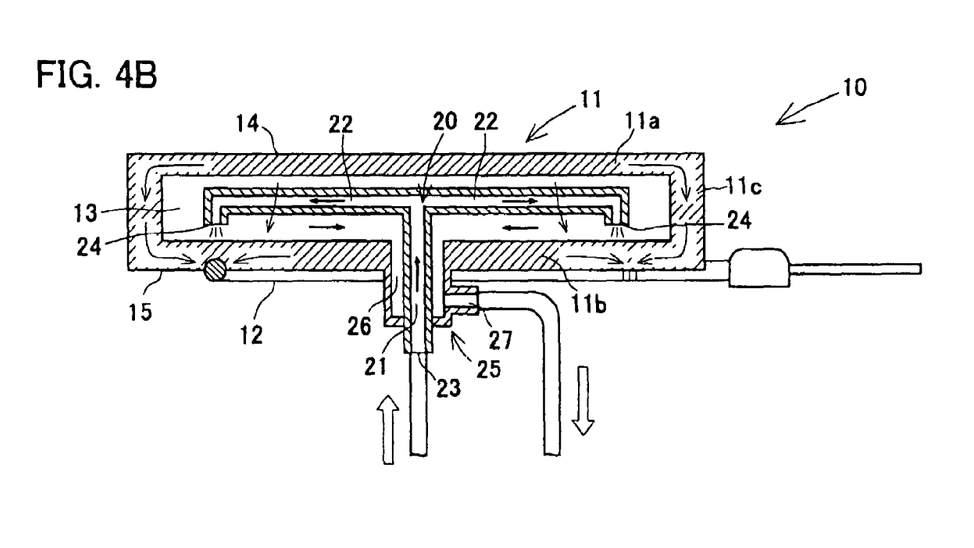
FIG. 4B is another schematic illustration showing coolant flow and heat transfer during cooling of the unit shown in FIGS. 1A–1C.

Next, making reference to FIGS. 4A and 4B, in the plate-type unit 10, a state of heat conduction in heating and cooling will be described below in detail. FIG. 4A is a schematic illustration showing heat transfer during heating, whereas FIG. 4B is a schematic illustration showing coolant flow and heat transfer during cooling. In FIGS. 4A and 4B, the state which the heat is transferred from higher temperature side to lower temperature side is shown using arrows schematically. Further, the state will be described in the condition that the coolant supplied to the piping 20 is a liquefied refrigerant to be accompanied with a change of phase.

Referring to the plate-type unit 10, heating by means of the heater 12 allows the heat to be transferred as follows. When energizing the heater 12, as seen in FIG. 4A, a part of the heat which is generated at the heater 12 is transferred to the upper part 11a from the heater 12 via the peripheral wall 11c of the hollow plate 11 so as to rise the temperature of the control face 14 from its fringe. Further, the rest of the heat is transferred and diffused into the bottom part 11b so as to rise the temperature of the bottom part 11b, and accordingly the upper part 11a is heated by convection of the gas (i.e., the refrigerant) filled in the cavity 13 and/or radiation from the bottom part 11b.

As a result, the heat transferred from the peripheral wall 11c and the heat radiated from the bottom part 11b serves to heat the upper part 11a so that it has a substantially uniform temperature over its top surface, that is, the control face 14 is heated to a substantially uniform temperature over all the face. Consequently, controlling the electric power supplied to the heater 12 makes possible to heat the control face 14 to the predetermined temperature, with a substantially uniform temperature distribution on the control face 14.

On the other hand, referring to the plate-type unit 10, cooling by means of the refrigerant allows the heat to be transferred as follows. As seen in FIG. 4B, the liquefied refrigerant supplied to the opening 23 flows through the main pipe 21 into the each branch pipe 22 separately, and is jetted toward the bottom part 11b from the each nozzle 24 of the each branch pipe 22. In this case, the portion of the bottom part 11b to which the refrigerant is jetted is the inner surface of the portion where the heater 12 is secured. Consequently, when the refrigerant is jetted, the bottom part 11b is cooled in circular along the portion to which the heater 12 is secured. According to such a structure, the heat of the upper part 11a of the control face 14 is transferred through the periphery wall 11c to the portion where the bottom part 11b is cooled so as to cool the control face 14 from its fringe.

Further, the heat of the bottom part 11b is transferred toward the annular area where the coolant (i.e., the refrigerant) is jetted so as to cool the bottom part 11b entirely. Cooling the bottom part 11b allows the upper part 11a to be cooled by convection of the gas (i.e., the coolant) filled in the cavity 13 and/or radiation from the bottom part 11b. As a result, the heat transferred toward the peripheral wall 11c and the cooling by the bottom part 11b serves to cool the upper part 11a so that it has a substantially uniform temperature over its top face, that is, the control face 14 is cooled to a substantially uniform temperature over all its face. Consequently, controlling the coolant supply to the piping 20 makes possible to cool to the predetermined temperature, while maintaining substantially uniform temperature distribution on the control face 14.

Therefore, with the plate-type unit 10 of this embodiment, adjusting the heater 12 and/or the coolant supply to the piping 20 can achieve temperature control to the predetermined temperature, though employing a refrigerant accompanied with a change of phase as a coolant, with the substantially uniform temperature distribution on the control face 14 in a wide temperature range that are from lower to higher.

The plate-type unit 10 of this embodiment has a basic characteristics of heating and cooling described above. Thus, adjusting both of the heater 12 and the coolant supply makes possible to control temperature extremely precisely to the target temperature, with a substantially uniform temperature distribution on the control face 14.

For example, when the temperature of the control face 14 exceeds the target temperature resulting from energizing the heater 12, cooling by jetting the coolant while controlling the coolant supply can lower the temperature of the control face 14 to the target temperature within a very short period of time. On the other hand, when the temperature of the control face 14 falls below the target temperature resulting from jetting the coolant, heating by the heater 12 can rise the temperature of the control face 14 to the target temperature within a very short period of time. In other words, it makes possible to control precisely the temperature of the control face 14 to the target temperature, as it is possible to decrease differences between the temperature of the control face 14 and the target temperature within a very short period of time when those differences are caused, maintaining the uniformity of the temperature of the control face 14.

The plate-type unit 10 of above-described embodiment, as seen in FIG. 3, employs the piping 20 with the six branch pipes 22 extended radially from the main pipe 21, though it is also possible to give the similar function by means of another structure. Details in structure of a modified embodiment of the piping 20 will now be described, making reference to FIGS. 5 and 6.

Figure 5:
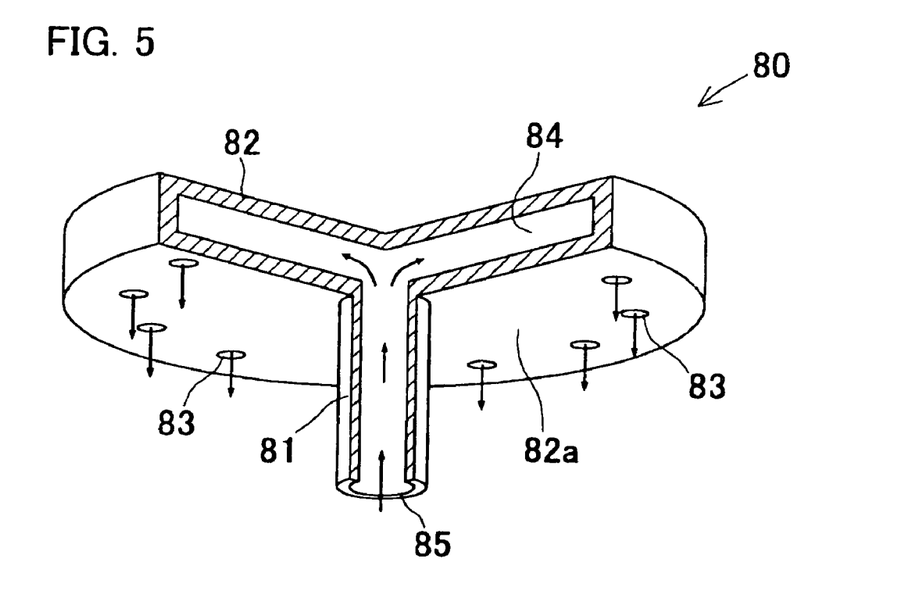
FIG. 5 is a partly broken perspective view of a modified embodiment of a piping of the unit shown in FIGS. 1A–1C.

FIG. 5 is a partly broken perspective view showing another piping 80 of a modified embodiment. The piping 80 shown in FIG. 5 is of a type having a disc-shaped distributor 82 at a top end of a vertically-extending main pipe 81 for supplying the coolant. The distributor 82 has a cavity 84 therein serving as a passage for the coolant. The distributor 82 is slightly smaller than the cavity 13 of the hollow plate 11 (see FIGS. 2B and 3) and has a size that the distributor 82 is accommodated completely in the cavity 13 of the plate 11. The main pipe 81 is secured vertically along a central axis of a bottom part 82a of the distributor 82 and communicates with the cavity 84 in the distributor 82. A plurality of through-holes 83 are formed through the bottom part 82a of the distributor 82 at equal intervals on a circle concentric with the edge of the part 82a and having a diameter slightly smaller than the part 82a. The through-holes 83 function as jetting holes 83 of the coolant.

The jetting holes 83 faces to the portion to which the heater 12 is secured when securing the piping 80 to the interior of the hollow plate 11 (see FIG. 3).

Referring to the piping 80, the coolant supplied to an opening 85 rises in the main pipe 81 so as to flow into the cavity 84 in the distributor 82, and which coolant is distributed radially in the horizontal directions. Then the distributed coolant is jetted downwardly from the jetting holes 83.

Consequently, the piping 80 has similar function to that of the piping 20 shown in FIG. 3, and proper determination of calibers and intervals of the jetting holes 83 enables to jet the coolant substantially uniformly along the portion to which the heater 12 is secured.

Figure 6:
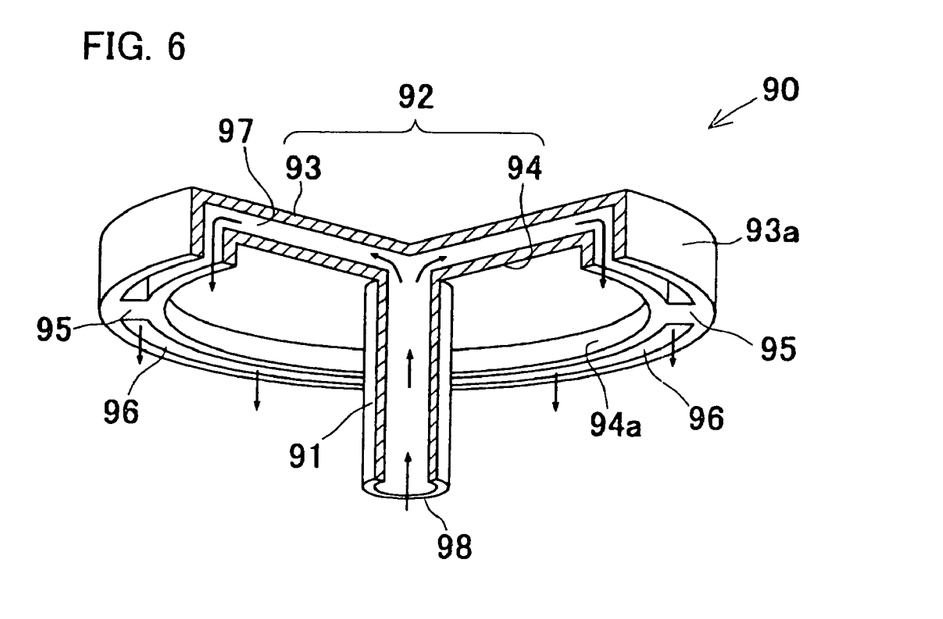
FIG. 6 is a partly broken perspective view of another modified embodiment of a piping of the unit shown in FIGS. 1A–1C.

FIG. 6 is a partly broken perspective view showing a still another piping 90 of another modified embodiment. The piping 90 shown in FIG. 6 is of type having a disc-shaped distributor 92 at a top end of a vertically-extending main pipe 91 for supplying the coolant. The distributor 92 comprises an upper distributing plate 93, a lower distributing plate 94 and a connecting portion 95 connecting the plates. The upper and lower distributing plates 93 and 94 are of a lid shape with the outer edge of the plate bent downwardly over the entire edge, and the upper plate 93 is slightly larger than the lower plate 94. The upper plate 93 is integrated with the lower plate 94 with a predetermined annular gap by being connected by the connecting portion 95 between annular bends 93a and 94a.

In other words, the distributor 92 has a cavity 97 that extends radially in the horizontal directions between the upper distributing plate 93 and the lower distributing plate 94. The cavity 97 extends to the peripheral wall and communicates with an annular cavity 96 which is formed downwardly between the annular bends 93a and 94a The distributor 92 is slightly smaller than the cavity 13 of the hollow plate 11 (see FIG. 3) and has a size that the distributor 92 is accommodated completely in the cavity 13. The main pipe 91 is secured vertically and along a central axis of the lower distributing plate 94 and communicates with the cavity 97. The annular cavity 96 faces to the portion to which the heater 12 is secured when securing the piping 90 to the interior of the hollow plate 11 (see FIG. 3).

Referring to the piping 90, the coolant supplied through its opening 98 for supplying the coolant rises in the main pipe 91 so as to flow in the cavity 97 of the distributor 92, and which coolant is distributed radially in the horizontal directions. Then the distributed coolant is jetted downwardly from the annular cavity 96 of the outer peripheral part. Consequently, the piping 90 has similar function to that of the piping 20 shown in FIG. 3, and it is possible to jet the coolant substantially uniformly in circular along the portion to which the heater 12 is secured.

As for the piping 80 shown in FIG. 5, the cavity 13 might be separated up and down by the distributor 82, resulting in decreasing a heat conductive efficiency by the radiation and the convection to the control face 14. Further, as for the piping 90 shown in FIG. 6, heat conductive efficiency to the control face 14 might be decreased as well resulting from the distributor 92. In these cases, forming properly through-holes which pass through vertically the distributors 82 and 92 can improve the heat conductive efficiency by the radiation and the convection to the control face 14.

Figure 7:
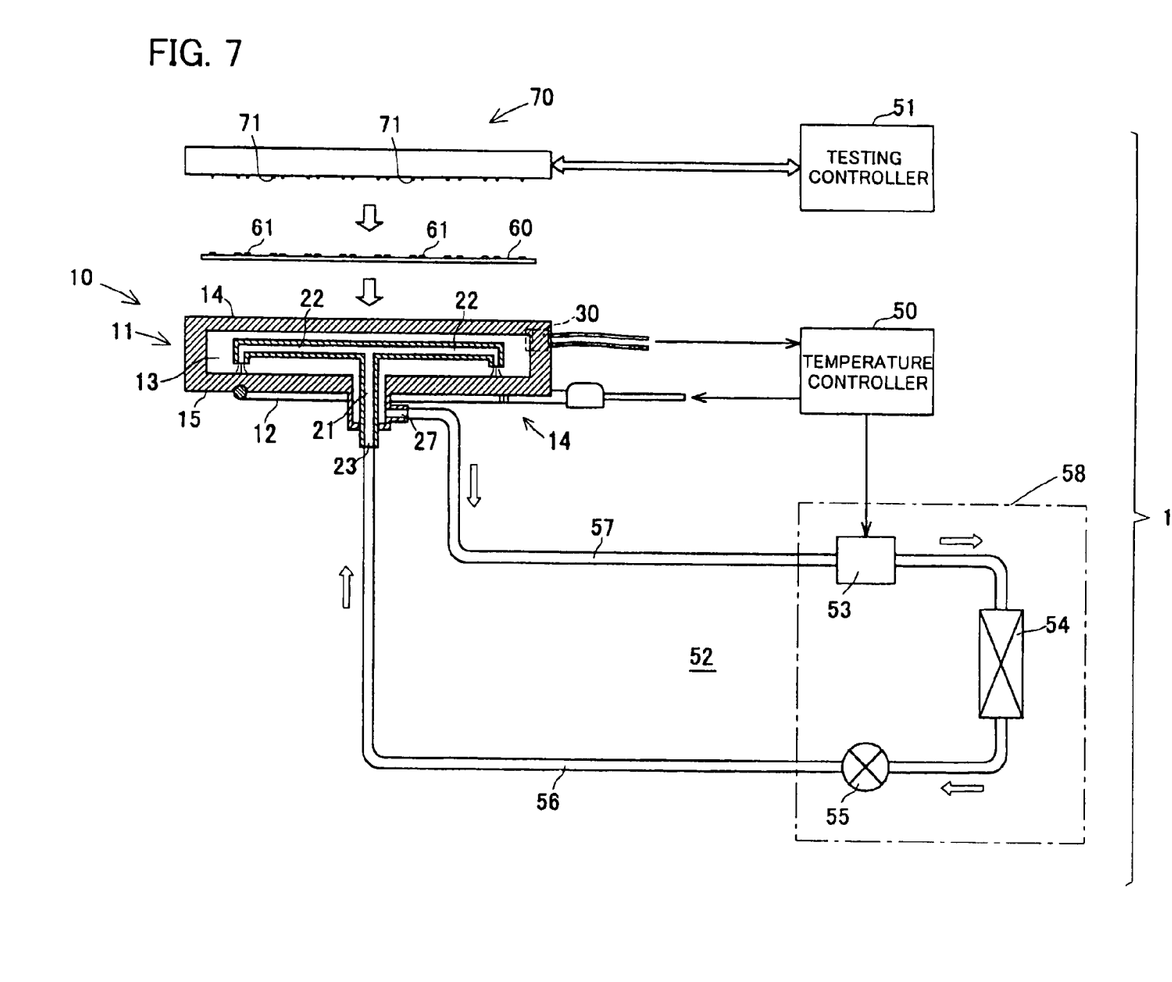
FIG. 7 is a schematic illustration of a testing instrument that is a preferred embodiment incorporating the unit shown in FIGS. 1A–1C.

Next, a testing instrument 1 of a preferred embodiment will be described below in details, making reference to FIG. 7. FIG. 7 is a schematic illustration of the testing instrument 1 that is the preferred embodiment.

The testing instrument 1 of this embodiment is constructed in such a manner having a temperature controller 50, a testing controller 51, a cooling circuit 52 and a prober 70 in addition to the plate-type unit 10.

The temperature controller 50 adjusts the heater 12 and the cooling circuit 52 so as to control heating and cooling of the plate-type unit 10.

The cooling circuit 52 is formed by connecting the plate-type unit 10 with a compressor 53, a condenser 54 and an expansion valve 55 in series and is a circulating system for circulating a refrigerant such as a hydrochlorofluorocarbon. The compressor 53, the condenser 54 and the expansion valve 55 is connected in series in this order to form a cooling device 58, and then the expansion valve 55 is connected with the opening 23 for supplying the refrigerant of the plate-type unit 10 through a circulating feed pipe 56. On the other hand, the outlet 27 for recovering the coolant of the plate-type unit 10 is connected with the compressor 53 through a circulating return pipe 57.

Referring to the cooling circuit 52, the refrigerant compressed in the compressor 53 is liquefied by cooling at the condenser 54, and the liquefied refrigerant is supplied to the plate-type unit 10 through the circulating feed pipe 56 in liquid phase or in gas-liquid mixture phase while being decompressed with the expansion valve 55. On the other hand, the gasified refrigerant discharged from the plate-type unit 10 returns through the circulating return pipe 57 to the compressor 53, and circulates in liquefied phase again. In this embodiment, the temperature controller 50 adjusts the compressor 53 so as to control continuously the liquefied refrigerant supply to the plate-type unit 10.

The prober 70 has a number of probes 71. The prober 70 applies supply voltage, test voltage and the like supplied from the testing controller 51, which is connected with the prober 70, on a semiconductor wafer 60 (a test piece), a device to be tested, through the probes 71. Further, the prober 70 functions as transferring output voltage from the semiconductor wafer 60 to the testing controller 51 through the probes 71. In other words, the prober 70 applies voltage such as the supply voltage supplied from the testing controller 51 to the semiconductor wafer 60, whereas having the function of an electrode for transferring the output voltage from the semiconductor wafer 60 to the testing controller 51.

In the testing instrument 1 of this embodiment, a semiconductor wafer burn-in test (viz. temperature test) is performed according to the following procedure. First of all, the heater 12 and the compressor 53 are controlled so that the temperature detected by the temperature sensor 30 corresponds with the predetermined temperature at the temperature controller 50. On the other hand, the semiconductor wafer 60 to be brought to the burn-in test is put on the control face 14 of the plate-type unit 10 and in turn the prober 70 is put on the semiconductor wafer 60 so as to cover the top face thereof. Thereby each probe 71 on the prober 70 comes in contact with each bump 61 formed on the semiconductor wafer 60 so as to turn electricity through each integrated circuit of the semiconductor wafer 60 from the testing controller 51 through the prober 70.

In this way, the semiconductor wafer 60 is driven in the energized condition by the supply voltage, the test voltage and the like supplied from the testing controller 51, while the burn-in test is performed under temperature determined by the control face 14 of the plate-type unit 10.

The testing controller 51 observes the voltage output from each chip of the semiconductor wafer 60 so as to detect a chip causing an irregular voltage for distinguishing from a normal chip.

In the burn-in test, as described above, it is also possible to adjust the temperature of the control face 14 to the target temperature by controlling either of the power supply to the heater 12 or the refrigerant supply.

Further, it is also possible to adjust the temperature of the control face 14 to the target temperature by controlling both of the power supply to the heater 12 and the refrigerant supply. Controlling both thereof makes possible to correct immediately to the target temperature and to adjust the temperature of the control face 14 precisely to the target temperature with the uniformity of the temperature distribution over the control face 14, when differences between the temperature of the control face 14 and the target temperature are caused.

Thus, the testing instrument 1 incorporating the plate-type unit 10 of this embodiment employs such a structure as supplying the coolant which is the refrigerant accompanied with a change of phase directly to the plate-type unit 10, while the burn-in test can be performed by adjusting the temperature of the control face 14 precisely to the target temperature. Therefore, cooling system of the plate-type unit 10 can be constituted by only the cooling circuit 52 as compared with the structure in the related art involving the secondary coolant. In such arrangement, this makes it possible to remarkably simplify the structure of the cooling system, to reduce volume and cost of apparatus.

This embodiment described above determines positions and arrangements of the heater 12 and the piping 20 so as to obtain a substantially uniform temperature distribution over all the face of the control face 14 of the plate-type unit 10. However, the invention is not delimited thereto. For example, it may be possible to secure the heater 12 to the hollow plate 11 so that the temperature distribution pattern of the control face 14 is subject to be of compensating a disproportion of temperature rise of each part accompanied with turning electricity through the semiconductor wafer 60. In this case, in the burn-in test, it is possible to maintain the semiconductor wafer 60 itself, which is the device to be tested, to the target temperature uniformly over all its face, as well as it can provide the burn-in test, the reliability of which is improved, thanks to the uniformity of the temperature of each integrated circuit to be formed on the wafer.

Further, the testing instrument 1 shown in this embodiment, for simplifying the description, employs a structure provided with the temperature sensor 30 for detecting the temperature of the hollow plate 11. However, being not delimited thereto, a temperature sensor for detecting the temperature of the semiconductor wafer 60 or of the coolant supplied to the plate-type unit 10 may be disposed for controlling referring to those detected temperatures in the temperature controller 50, so as to be possible to control the temperature more precisely.

Still further, in this embodiment, the plate-type unit 10 and the testing instrument 1 thereof for performing a burn-in test (viz. temperature test) for the semiconductor wafer 60 are illustrated, though the invention can also provide units for varying temperatures and testing instruments for performing temperature tests not only for semiconductor wafers but also for devices or apparatus to be tested such as electronic components or electric equipment. Still further, it is also possible to apply the unit in the present invention to environmental testing instruments such as temperature and humidity chambers.

The invention claimed is:

1. A unit for varying a temperature of a test piece by controlling a temperature of a control face comprising:
    a hollow plate having a cavity formed therein, an inner surface defining the cavity, and an outer surface;
    a piping for supplying a coolant therethrough; and
    a heater thermally in contact with the plate;
    wherein the outer surface has a portion acting as the control face, and
    wherein the piping is combined with the plate so as to have at least one outlet in the cavity,
    so that the coolant is jetted toward a target area within the cavity so as to control temperature of the control face by means of the heater and the coolant,
    wherein the coolant is a refrigerant that is in gas phase at normal temperature and in liquid phase or in gas-liquid mixture phase when it is supplied toward the target area.

2. A unit for varying a temperature of a test piece by controlling a temperature of a control face comprising:
    a hollow plate having a cavity formed therein, an inner surface defining the cavity and comprising at least one face, and an outer surface comprising at least one face;
    a piping for supplying a coolant therethrough; and
    a heater thermally in contact with the plate;
    wherein the outer surface has a portion acting as the control face, and
    wherein the piping is combined with the plate so as to have at least one outlet in the cavity,
    so that the coolant is jetted toward a target area within the cavity so as to control temperature of the control face by means of the heater and the coolant,
    wherein the hollow plate is of a substantially cylindrical shape with its top face acting as the control face,
    wherein the heater is of an annular shape and secured to a portion of the bottom face of the plate,
    wherein the target area is the inner surface area of the portion to which the heater is secured, and
    wherein the heater is secured to at least one of the faces making up the outer surface of the plate, but not to the control face.

3. The unit as defined in claim 2,
    wherein the piping comprises a main pipe extending out of the plate and a plurality of branch pipes extending radially from the main pipe,
    the main pipe being positioned substantially along the central axis of the heater,
    each of the branch pipes having one end in fluid communication with the main pipe and the other end directed to the target area.

4. The unit as defined in claim 2,
    wherein the piping comprises a main pipe and a disc-shaped coolant distributor,
    the main pipe being positioned substantially along the central axis of the heater,
    wherein the distributor has a cavity therein in communication with the main pipe and further has a plurality of openings so as to make the cavity in the distributor to communicate with the cavity in the plate,
    the openings facing to the target area.

5. The unit as defined in claim 3,
    further comprising a coolant recovery portion formed adjacent to the main pipe so as to recover coolant jetted into the cavity in the plate.

6. A unit for varying a temperature of a test piece by controlling a temperature of a control face comprising:
    a hollow plate having a cavity formed therein, an inner surface defining the cavity, and an outer surface;
    a piping for supplying a coolant therethrough; and
    a heater thermally in contact with the plate;
    wherein the outer surface has a portion acting as the control face, and
    wherein the piping is combined with the plate so as to have at least one outlet in the cavity,
    so that the coolant is jetted toward a target area on a surface within the cavity having a predetermined area and so as to control temperature of the control face by means of the heater and the coolant,
    wherein the target area is strategically determined so that coolant is jetted at the predetermined area in a non-uniform manner over less than the entire predetermined area and so that a temperature change in the target area produces a temperature change of the control face with a substantially uniform temperature distribution over the whole control face.

7. The unit as defined in claim 6,
    wherein the heater is secured to a portion so that a temperature change in the portion produces a temperature change of the control face with a substantially uniform temperature distribution over the whole control face.

8. The unit as defined in claim 6,
    wherein the coolant is a refrigerant that is in gas phase at normal temperature and in liquid phase or in gas-liquid mixture phase when it is supplied toward the target area.

9. The unit as defined in claim 6,
    wherein the heater is secured to at least one of the faces making up the outer surface of the plate except the control face.

10. The unit as defined in claim 6,
    wherein the hollow plate is of a substantially cylindrical shape with its top face acting as the control face,
    wherein the heater is of an annular shape and secured to a portion of the bottom face of the plate, and
    wherein the target area is the inner surface area of, and substantially only, the portion to which the heater is secured.

11. The unit as defined in claim 10,
    wherein the piping comprises a main pipe extending out of the plate and a plurality of branch pipes extending radially from the main pipe,
    the main pipe being positioned substantially along the central axis of the heater, and
    each of the branch pipes having one end in fluid communication with the main pipe and the other end directed to the target area.

12. The unit as defined in claim 10,
wherein the piping comprises a main pipe and a disc-shaped coolant distributor,
the main pipe being positioned substantially along the central axis of the heater,
wherein the distributor has a cavity therein in communication with the main pipe and further has a plurality of openings so as to make the cavity in the distributor to communicate with the cavity in the plate,
the openings facing to the target area.

13. The unit as defined in claim 11,
further comprising a coolant recovery portion formed adjacent to the main pipe so as to recover coolant jetted into the cavity in the plate.

14. A unit for varying a temperature of a test piece by controlling a temperature of a control face comprising:
a hollow plate having a cavity formed therein, an inner surface defining the cavity, and an outer surface;
a piping for supplying a coolant therethrough; and
a heater thermally in contact with the plate;
wherein the outer surface has a portion acting as the control face and having an area, and
wherein the piping is combined with the plate so as to have at least one outlet in the cavity,
so that the coolant is jetted toward a target area within the cavity so as to control temperature of the control face by means of a heater and coolant,
wherein the target area is the inner surface area of the portion to which the heater is secured or the proximity of the inner surface area, the target area being determined so that it shows especially high temperature rise when the heater is energized,
wherein the heater is strategically secured to a portion having an area substantially less than the area of the control face and so that a temperature change in the portion produces a temperature change of the control face with a substantially uniform temperature distribution over the whole control face.

15. A unit for varying a temperature of a test piece by controlling a temperature of a control face comprising:
a hollow plate having a cavity formed therein, an inner surface defining the cavity, and an outer surface;
a piping for supplying a coolant thereth rough; and
a heater thermally in contact with the plate;
wherein the outer surface has a portion acting as the control face, and
wherein the piping is combined with the plate so as to have at least one outlet in the cavity,
so that the coolant is jetted toward a target area within the cavity so as to control temperature of the control face by means of a heater and coolant,
wherein the target area is the inner surface area of the portion to which the heater is secured or the proximity of the inner surface area, the target area being determined so that it shows especially high temperature rise when the heater is energized,
wherein the coolant is a refrigerant that is in gas phase at normal temperature and in liquid phase or in gas-liquid mixture phase when it is supplied toward the target area.

16. A unit for varying a temperature of a test piece by controlling a temperature of a control face comprising:
a hollow plate having a cavity formed therein, an inner surface defining the cavity and comprising at least one face, and an outer surface comprising at least one face;
a piping for supplying a coolant therethrough; and
a heater thermally in contact with the plate;
wherein the outer surface has a portion acting as the control face, and
wherein the piping is combined with the plate so as to have at least one outlet in the cavity,
so that the coolant is jetted toward a target area within the cavity so as to control temperature of the control face by means of a heater and coolant,
wherein the target area is the inner surface area of the portion to which the heater is secured or the proximity of the inner surface area, the target area being determined so that it shows especially high temperature rise when the heater is energized,
wherein the hollow plate is of a substantially cylindrical shape with its top face acting as the control face,
wherein the heater is of an annular shape and secured to a portion of the bottom face of the plate,
wherein the target area is the inner surface area of the portion to which the heater is secured, and
wherein the heater is secured to at least one of the faces making up the outer surface of the plate, but not to the control face.

17. The unit as defined in claim 16,
wherein the piping comprises a main pipe extending out of the plate and a plurality of branch pipes extending radially from the main pipe,
the main pipe being positioned substantially along the central axis of the heater, and
each of the branch pipes having one end in fluid communication with the main pipe and the other end directed to the target area.

18. The unit as defined in claim 16,
wherein the piping comprises a main pipe and a disc-shaped coolant distributor,
the main pipe being positioned substantially along the central axis of the heater,
wherein the distributor has a cavity therein in communication with the main pipe and further has a plurality of openings so as to make the cavity in the distributor to communicate with the cavity in the plate,
the openings facing to the target area.

19. The unit as defined in claim 17,
further comprising a coolant recovery portion formed adjacent to the main pipe so as to recover coolant jetted into the cavity in the plate.

20. A testing instrument comprising a unit for varying a temperature of a test piece by controlling a temperature of a control face and a cooling device for liquefying gasified refrigerant,
the unit comprising:
a hollow plate having a cavity formed therein, an inner surface defining the cavity, and an outer surface;
a portion of the outer surface acting as a control face;
a piping for supplying a refrigerant therethrough; and
a heater thermally in contact with the plate;
wherein the piping is combined with the plate so as to have at least one outlet in the cavity,
wherein the outer surface has a portion acting as the control face, and
wherein the cooling device is connected to the piping and the cavity so as to form a cooling circuit to circulate the refrigerant therein, so that the refrigerant is jetted toward a target area within the cavity so as to control temperature of the control surface by means of the heater and the refrigerant,
the plate being cooled by means of the latent heat of vaporization of the refrigerant.

21. The testing instrument as defined in claim 20,
wherein the hollow plate has a substantially cylindrical shape with its top face acting as the control face,
wherein the heater is of an annular shape and secured to the bottom face of the plate, and
wherein the target area is the inner surface area of the portion to which the heater is secured.

22. The testing instrument as defined in claim 21,
wherein the piping comprises a main pipe and a plurality of branch pipes extending radially from the main pipe, the main pipe being positioned substantially along the central axis of the heater, and each of the branch pipes having one end in fluid communication with the main pipe and the other end directed to the target area.

\* \* \* \* \*